United States Patent
Anderson et al.

[11] Patent Number: 6,115,769
[45] Date of Patent: *Sep. 5, 2000

[54] METHOD AND APPARATUS FOR PROVIDING PRECISE CIRCUIT DELAYS

[75] Inventors: Michael B. Anderson; Gregory A. Tabor; Mark J. Jander, all of Colorado Springs, Colo.

[73] Assignee: LSI Logic Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/672,784

[22] Filed: Jun. 28, 1996

[51] Int. Cl.$^7$ .................................................. H03H 11/26
[52] U.S. Cl. ........................... 710/128; 710/129; 375/361; 375/373; 327/262
[58] Field of Search ..................... 395/308, 309; 327/295, 270, 158, 115; 377/20; 307/269; 331/1 A

[56] References Cited

U.S. PATENT DOCUMENTS

| | | | |
|---|---|---|---|
| 3,728,679 | 4/1973 | McIntosh | 340/146.1 |
| 4,755,704 | 7/1988 | Flora et al. | 307/269 |
| 4,821,296 | 4/1989 | Cordell | 375/119 |
| 4,902,986 | 2/1990 | Lesmeister | 331/25 |
| 4,998,264 | 3/1991 | Woodward | 375/373 |
| 5,045,811 | 9/1991 | Lewis | 331/1 A |
| 5,081,655 | 1/1992 | Long | 375/119 |
| 5,103,466 | 4/1992 | Bazes | 375/361 |
| 5,123,100 | 6/1992 | Hisada et al. | 395/550 |
| 5,140,620 | 8/1992 | Woodward | 375/375 |
| 5,146,121 | 9/1992 | Searles et al. | 307/603 |
| 5,164,677 | 11/1992 | Hawkins et al. | 328/55 |
| 5,175,452 | 12/1992 | Lupi et al. | 327/262 |
| 5,206,889 | 4/1993 | Unkrich | 377/20 |
| 5,220,660 | 6/1993 | Yoshizawa et al. | 395/550 |
| 5,221,863 | 6/1993 | Motegi | 307/269 |
| 5,233,316 | 8/1993 | Yamada et al. | 331/45 |
| 5,278,873 | 1/1994 | Lowrey et al. | 375/118 |
| 5,287,025 | 2/1994 | Nishimichi | 307/603 |
| 5,309,035 | 5/1994 | Watson, Jr. et al. | 307/269 |
| 5,359,235 | 10/1994 | Coyle et al. | 307/296.1 |
| 5,384,784 | 1/1995 | Kawabata | 371/1 |
| 5,389,843 | 2/1995 | McKinney | 327/276 |
| 5,428,309 | 6/1995 | Yamauchi et al. | 327/15 |
| 5,448,205 | 9/1995 | Rothermel | 331/57 |
| 5,471,176 | 11/1995 | Henson et al. | 331/1 A |
| 5,475,814 | 12/1995 | Tomimitsu | 395/183.06 |
| 5,485,114 | 1/1996 | Funakura et al. | 327/262 |
| 5,488,332 | 1/1996 | De Loe, Jr. | 331/25 |
| 5,506,534 | 4/1996 | Guo et al. | 327/276 |
| 5,539,348 | 7/1996 | Young | 327/262 |
| 5,550,860 | 8/1996 | Georgiou et al. | 375/220 |
| 5,552,733 | 9/1996 | Lesmeister | 327/295 |
| 5,559,476 | 9/1996 | Zhang et al. | 331/57 |
| 5,586,308 | 12/1996 | Hawkins et al. | 395/556 |
| 5,596,765 | 1/1997 | Baum et al. | 395/800 |
| 5,621,774 | 4/1997 | Ishibashi et al. | 375/371 |
| 5,634,043 | 5/1997 | Self et al. | 395/558 |
| 5,636,254 | 6/1997 | Hase et al. | 375/371 |
| 5,646,564 | 7/1997 | Erickson et al. | 327/158 |
| 5,650,739 | 7/1997 | Hui et al. | 327/262 |
| 5,670,904 | 9/1997 | Moloney et al. | 327/277 |
| 5,692,166 | 11/1997 | Milhizer et al. | 395/551 |
| 5,729,719 | 3/1998 | Gates | 395/550 |
| 5,731,726 | 3/1998 | Farwell et al. | 327/277 |
| 5,778,214 | 7/1998 | Taya et al. | 395/551 |
| 5,822,329 | 10/1998 | Nakajima et al. | 371/1 |
| 5,822,330 | 10/1998 | Buckland et al. | 371/1 |
| 5,834,960 | 11/1998 | Heima et al. | 327/276 |

FOREIGN PATENT DOCUMENTS

| | | | |
|---|---|---|---|
| 0540449 | 5/1993 | European Pat. Off. | G06F 13/40 |
| 0610052 | 8/1994 | European Pat. Off. | H03K 5/15 |
| 0614281 | 9/1994 | European Pat. Off. | H03L 7/081 |

*Primary Examiner*—Ayaz R. Sheikh
*Assistant Examiner*—Eric S. Thlang

[57] ABSTRACT

A precise timing delay method and apparatus. A phase-locked loop (PLL) in combination with a timing reference is used to calibrate a precise delay. These delays are then duplicated throughout the chip and controlled by the same current as in the PLL. This makes the delays process, voltage, and temperature insensitive. The delays can be programmed by selecting the desired delay through a multiplexer. Providing high precision delays are particularly advantageous for use in devices such as computer bus isolators.

16 Claims, 7 Drawing Sheets

METHOD AND APPARATUS FOR PROVIDING PRECISE CIRCUIT DELAYS

TECHNICAL FIELD

The present invention relates to electrical circuitry, and more particularly to a technique for generating accurate delay of electrical signals.

BACKGROUND OF THE INVENTION

In asynchronous bus isolating/bridging applications, such as a SCSI isolator or bus extender, signals need to be precisely delayed by a predetermined amount in order to guarantee or even improve setup or hold times on the resultant output bus. Current techniques involve the use of a dynamically varying string of standard cells (such as inverters or buffers), of length determined by comparison to a reference delay or clock, to achieve a fixed delay. The delay elements are duplicated throughout the chip. This approach is large, very difficult to test and not very precise.

It is desirable to provide a precise delay circuit that is small. In addition, the delay elements should be tolerant of process, voltage, and temperature variations. The following techniques achieves all these goals.

SUMMARY OF THE INVENTION

The present invention is directed to a method and apparatus for generating precise delays of electrical signals. The approach is based on a phase-locked loop (PLL), and uses a reference clock, typically a crystal oscillator, as a timing reference. This removes the necessity of using a self calibration feature. The PLL locks to the reference clock, generating some integer multiple of the reference frequency. The PLL has a voltage-controlled oscillator (VCO) that is made up of a string of delay elements. These delay elements are precisely controlled by the closed loop dynamic of the PLL. Hence, the delay is precisely controlled by the timing reference. By using a PLL with a timing reference, we can achieve the goals of process, voltage, and temperature insensitivity. We then duplicate the delays (which make up the VCO) to particular locations on the chip where a controlled delay is needed. In the preferred embodiment, the delay cells are current controlled. In this case, a number of currents are distributed throughout the chip to the delay cells. Finally, programmability can be incorporated by using a number of delay cells and selecting the desired delay through a multiplexer.

To summarize, we provide a precise delay that is generated by a timing reference via a PLL. The delay is then duplicated across the chip in the form of a delay cell which is current controlled. The delay cells tend to be much smaller than existing solutions. The techniques described hereinbelow reduce gate count from those of prior techniques, which saves chip area, test time and overall chip cost.

It is thus an object of the present invention to provide a precise delay of an electrical signal.

It is another object of the present invention to provide a method for delaying an electrical signal when propagating from one electrical element/device to another.

It is yet another object of the present invention to provide a delay technique using a phase-locked loop.

It is still another object of the present invention to provide a high precision programmable delay element.

It is yet another object of the present invention to provide an improved bus isolator/bridge circuit.

It is yet another object of the present invention to provide an improved bus isolator/bridge circuit having controllable delay elements.

Those having normal skill in the art will recognize the foregoing and other objects, features, advantages and applications of the present invention from the following more detailed description of the preferred embodiments as illustrated in the accompanying drawing.

DETAILED DESCRIPTION OF THE PREFERRED EMBODIMENT

Figure 1:
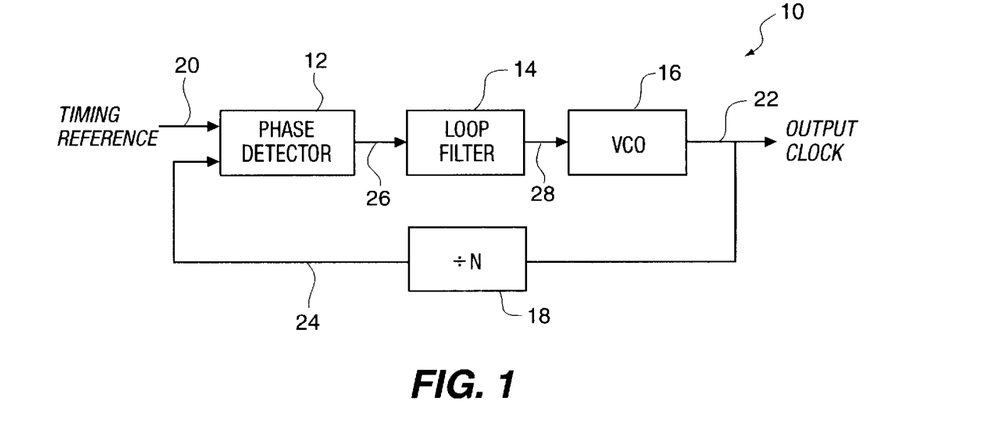
FIG. 1 is a block diagram of a phase-locked loop circuit.

Referring to FIG. 1, a PLL synthesizer circuit 10 comprises a phase detector 12, loop filter 14, voltage controlled oscillator (VCO) 16, and a divider 18. The phase detector 12 compares the phase of the timing reference 20 and the output 24 of divider 18. If there is a phase difference, an error signal 26, which is proportional to the phase difference, is sent to the loop filter 14. The VCO 16 then responds to the DC voltage 28 from the loop filter 14. As the voltage 28 increases, so does the frequency of the VCO, and conversely, as the voltage 28 decreases, so does the frequency of the VCO. The divider 18 allows for providing an output clock having a frequency that is N times the frequency of the timing reference or clock frequency appearing at 20. For example, if the input clock or timing reference 20 had a frequency of 40 MHz, and the divider had an N value of 5, the output frequency would be 200 MHz (i.e. 40 MHz×5).

Figure 2:
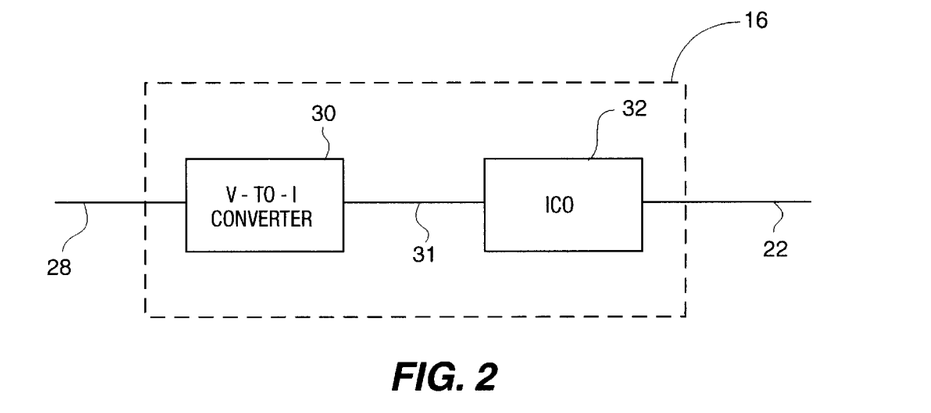
FIG. 2 is a block diagram of a voltage-controlled oscillator circuit.
Figure 3:
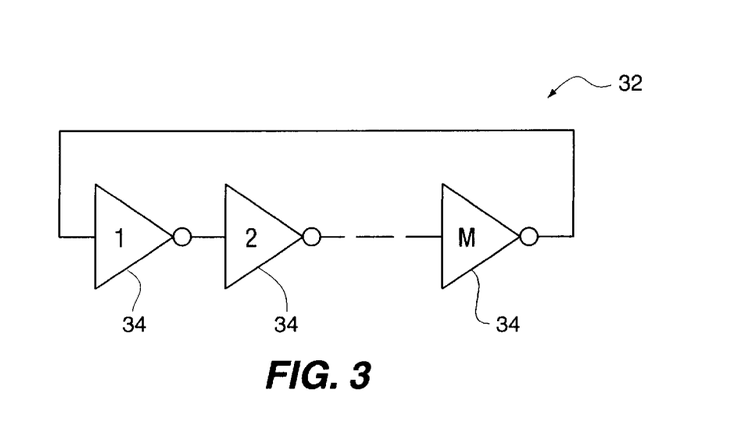
FIG. 3 is a schematic of a ring oscillator circuit.

The operation of the VCO 16 will now be described. The present invention preferably employs a current starved architecture. However, the techniques described herein can be generalized to any architecture that uses delay cells. Referring now to FIG. 2, a current controlled oscillator (ICO) 32 is used to provide a VCO 16 by adding a voltage-to-current converter 30 to its front end. One embodiment of the ICO is shown in FIG. 3. Using inverters 34 as delay cells, a ring oscillator is built having an odd number M of cascaded delay cells. The frequency of the oscillator can be computed by the relationship $$\text{freq} = \frac{1}{2} M \tau_d$$

where M is the number of stages and $\tau_d$ is the delay of the inverter. Stated another way, the delay of the inverter can be expressed as $$\tau_d = 2\text{ freq}/M$$

The frequency freq of the VCO is precisely controlled by the timing reference signal 20 (FIG. 1). Thus, as can be seen by the equations above, the delay $\tau_d$ of each inverter cell is also precisely controlled. The delay is precisely controlled by the closed loop dynamic of the PLL.

Figure 4A:
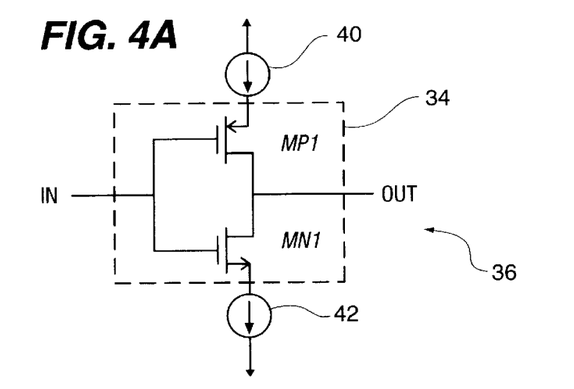
FIGS. 4A and 4B is a schematic of a delay cell.
Figure 4B:
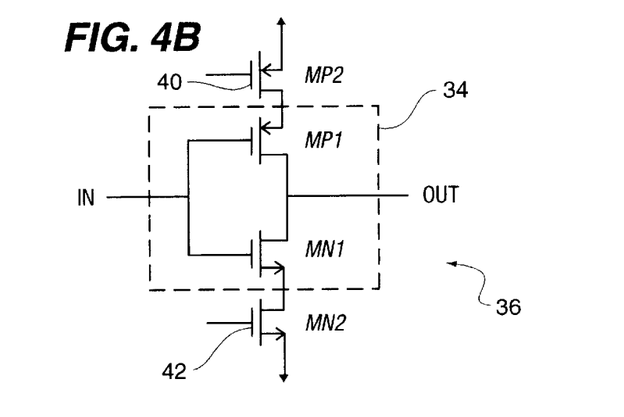

Inverters 34 are current starved inverters in the preferred embodiment. As its name suggests, the current in the inverter is starved by current sources in order to slow down the delay. The current starved inverter architecture used to create delay cells 36 is shown in FIG. 4A, and comprises an inverter 34 (comprising transistor pair MP1 and MN1) with two current sources 40 and 42. The amount of current provided by the current sources 40 and 42 determines the delay through the inverter 34. The current sources 40 and 42 are preferably realized, as shown in FIG. 4B, by transistors MP2 and MN2, respectively.

Figure 5:
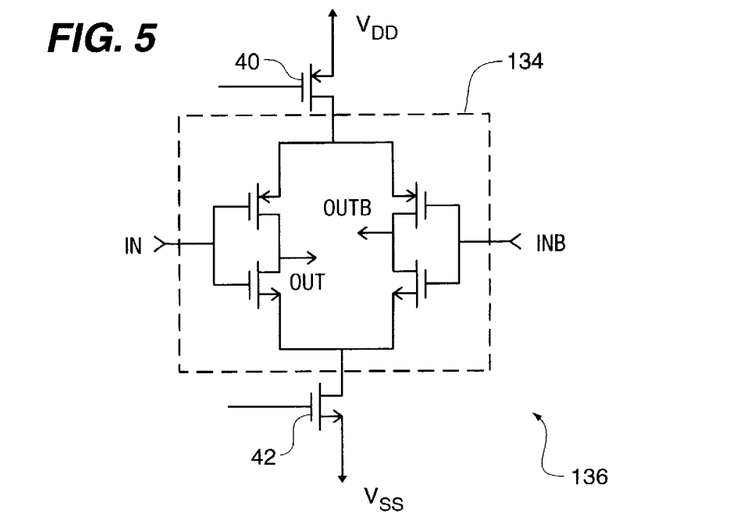
FIG. 5 is a schematic of a delay cell having a differential structure.

A differential structure can also be used. This would allow an even number of delay stages in the VCO where one stage would be cross coupled. The cell shown in FIG. 5 is a differential starved inverter delay cell 136. It can be used for differential type data, or followed by a differential to single-ended converter. Delay cell 136 comprises a differential inverter 134 and current sources 40 and 42. As with the delay cell shown in FIG. 4B, current sources 40 and 42 determine the delay through differential inverter 134.

Figure 6:
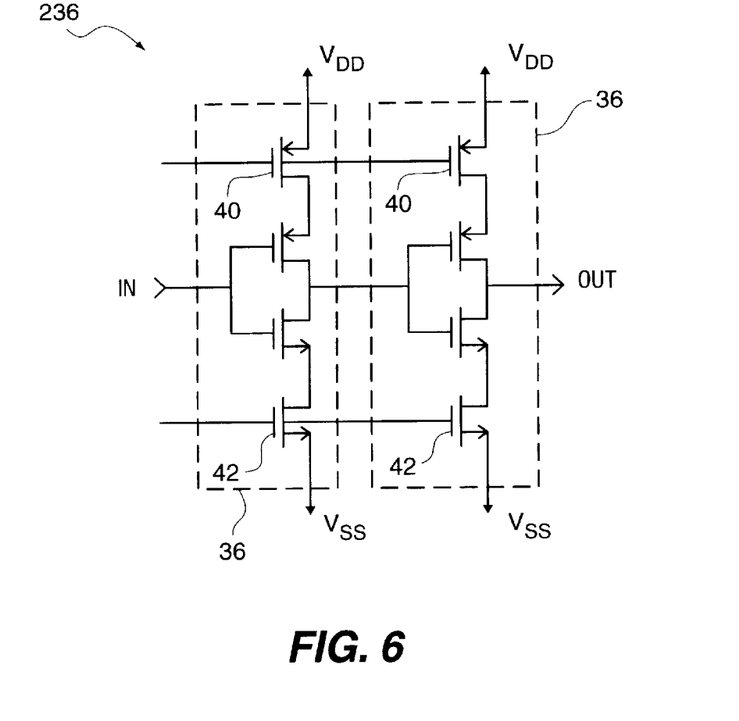
FIG. 6 is a schematic of two single-ended delay cells cascaded together.

To prevent inversion of the data signal, or to increase the delay of the cell, two single-ended delay cells 36 can be cascaded together as shown at 236 of FIG. 6. If more delay is required, more delay cells can be cascaded.

Now that we have a complete and precise delay, as described above, we duplicate similar delay cells throughout the integrated circuit device, and mirror the VCO current to the delay cells. Since this current directly relates to a known delay, this current can be used to generate substantially the same delay in these other similar delay cells.

Figure 7:
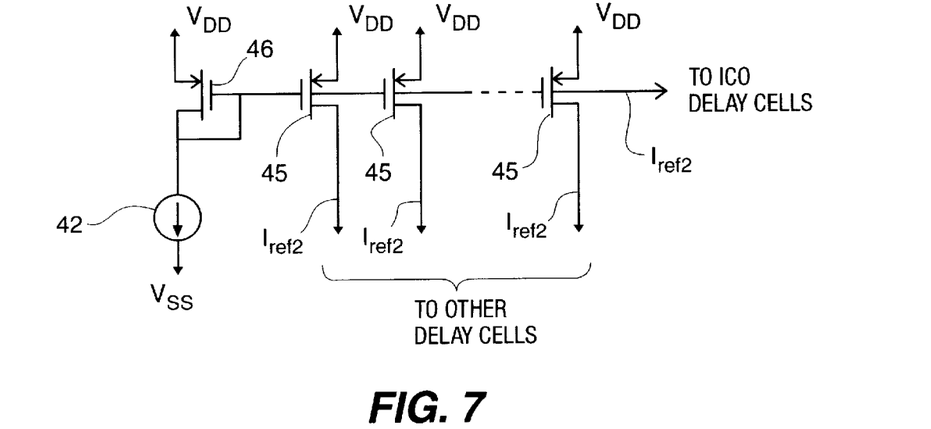
FIG. 7 is a schematic showing current mirroring from a current source.

Referring now to FIG. 7, current from current source 44 is mirrored by current mirror 46 to current sources 45. These current sources 45 are used to provide (1) a reference current $I_{ref}$ to other delay cells in the integrated circuit, and (2) to provide a reference current $I_{ref2}$ to the ICO delay cells. The delay cells in a given integrated circuit device will exhibit similar propagation characteristics. Thus, mirroring current to both the ICO delay cells of the VCO (which have a given, known delay in the ICO), as well as the other delay cells, will produce a substantially similar delay in both the ICO delay cells and the other delay cells of the integrated circuit device.

Figure 8:
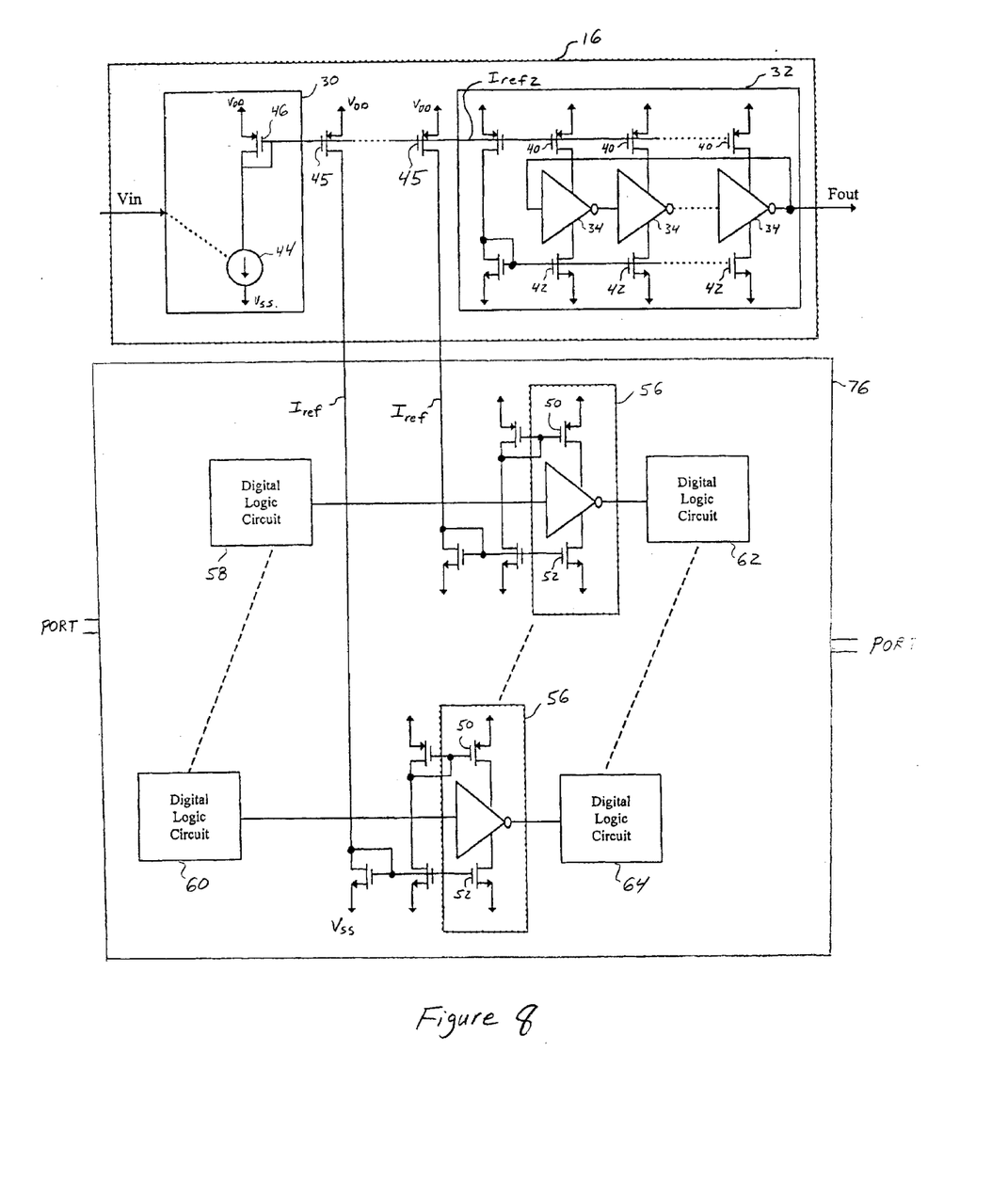
FIG. 8 is a schematic of a VCO in combination with an isolator circuit.

FIG. 8 shows how the mirrored current 48 from the VCO 16 is used to control the delay in other delay cells 56. As can be seen, this mirrored current 48 is used to control current sources 50 of delay cells 56. In addition, mirrored current 48 is used to control current sources 52 of delay cells 56. Delay cells 56, each including current sources 50 and 52 and a current-starved inverter 54, provide similar function and characteristics as the delay cell 36 of FIGS. 4A–B. Thus, the delay provided by delay cells 56 is substantially the same as that provided by delay cells 36 in the ICO 32. It is therefore possible to accurately and precisely delay electrical signals propagated from circuits such as 58 and 60 to circuits 62 and 64, respectively.

Figure 9:
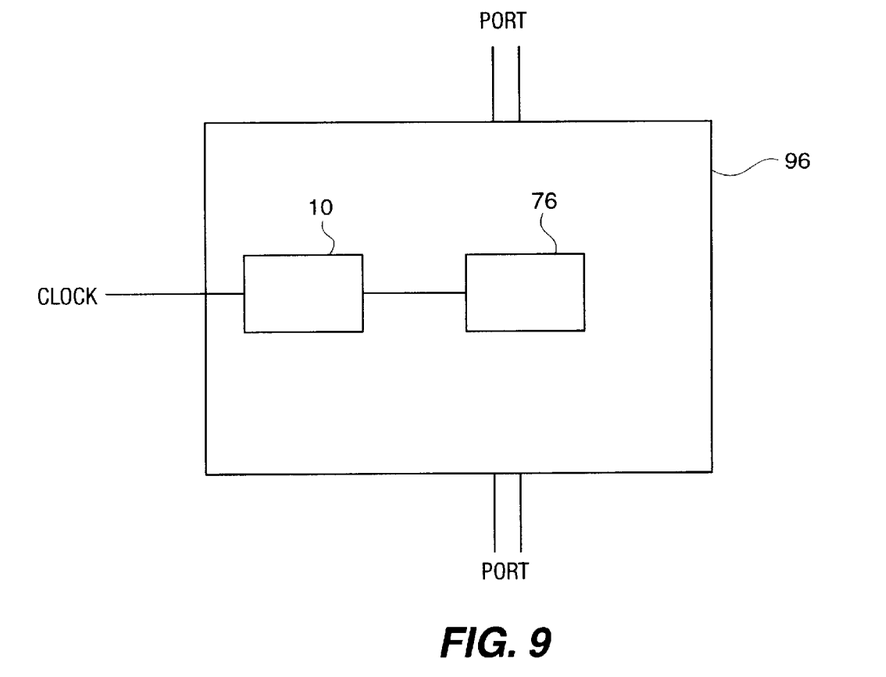
FIG. 9 is a block diagram for a bus isolator/bridge circuit.

An application for using the previously described precision delay technique is shown in FIG. 9. A bus isolator/bridge circuit 96 is shown, and comprises the above described PLL 10 along with digital and delay circuitry 76. The isolator bridge circuit 96 can be used to couple together to ports, such as computer buses, as will be later described below.

Figure 10:
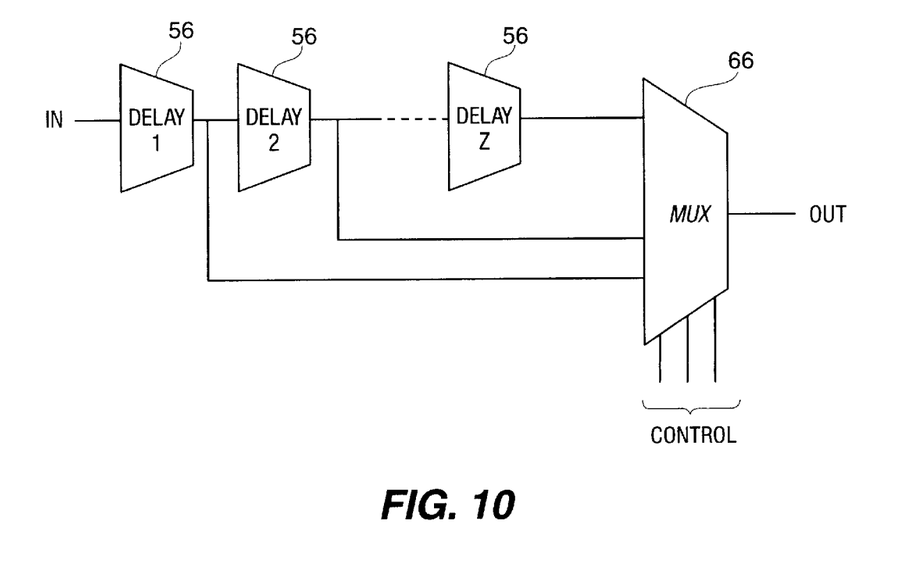
FIG. 10 is a schematic of a programmable delay circuit.

Programmability can be built in by cascading several delay cells together and selecting the desired delay through a multiplexer. This is shown in FIG. 10. Delay cells 56 are serially cascaded together in the preferred embodiment. The outputs of each successive stage are coupled to the input of multiplexer 66. By proper selection of the multiplexer's control lines, it is possible to delay the propagation of the IN signal to the OUT signal by 1×, 2× . . . or ZX. Traditional techniques are used to manipulate the multiplexer control lines, such as hardwiring such lines to switches to allow user selectable delays, coupling the control lines to a microprocessor/controller for programmable control by such microprocessor/controller, etc.

A system using the above described delay techniques will now be described. A bus isolator/bridge may be desired to isolate two computer busses from one another, or bridge one bus to the other. Certain computer busses, such the small computer system interface (SCSI) bus, have well defined signal characteristics, such as allowable voltages/currents, timing, noise, etc. These signal characteristic requirements dictate certain constraints on cabling used to interconnect devices on the SCSI bus. Using an isolator on such a bus allows one to effectively extend the bus, as will now be shown by the following examples.

Figure 11A:
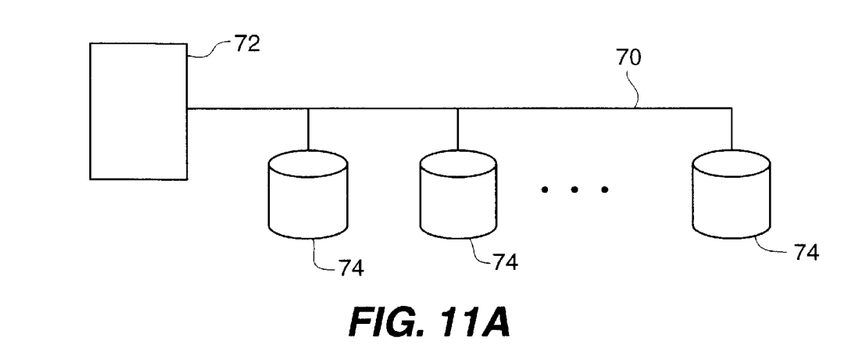
FIGS. 11A and 11B show a computer bus, and extension thereof.
Figure 11B:
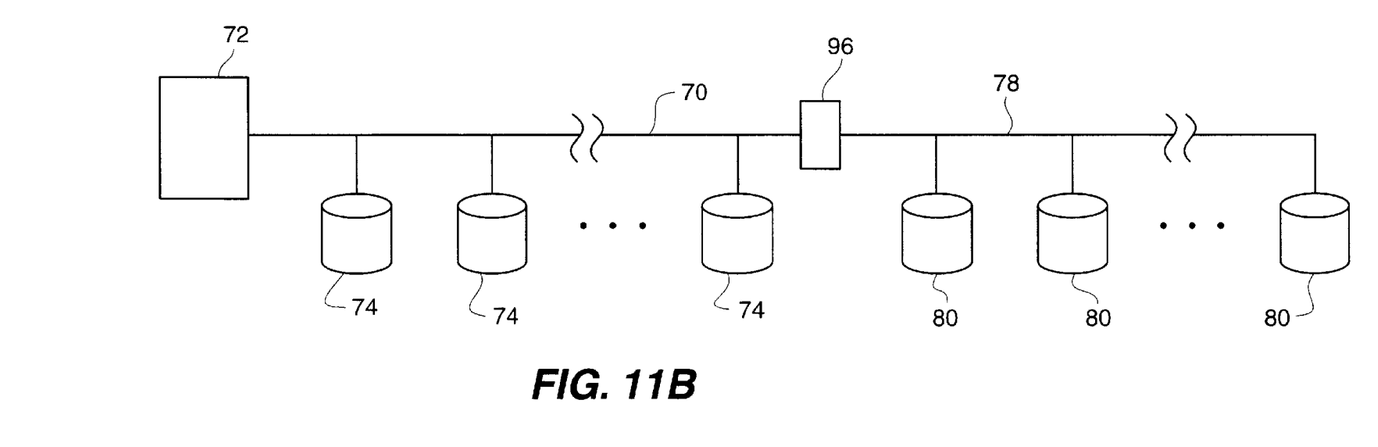

Referring to FIG. 11A, there is shown as SCSI bus cable interconnecting a plurality of devices on a SCSI bus. In the embodiment shown, SCSI controller 72 is coupled to a plurality of storage devices 74 via SCSI bus 70. Due to the above described signal characteristic constraints, there is a limited number of devices that are allowed to be coupled to SCSI bus 70. There is also a constraint as to the physical length of the SCSI cable providing the bus interconnect to the devices. By adding a bus isolator/bridge, the bus can be effectively extended. This is shown in FIG. 11B, where bus isolator/bridge 96 allows for connecting an additional SCSI cable 78, to allow for coupling of additional SCSI devices 80 to controller 72.

Figure 12:
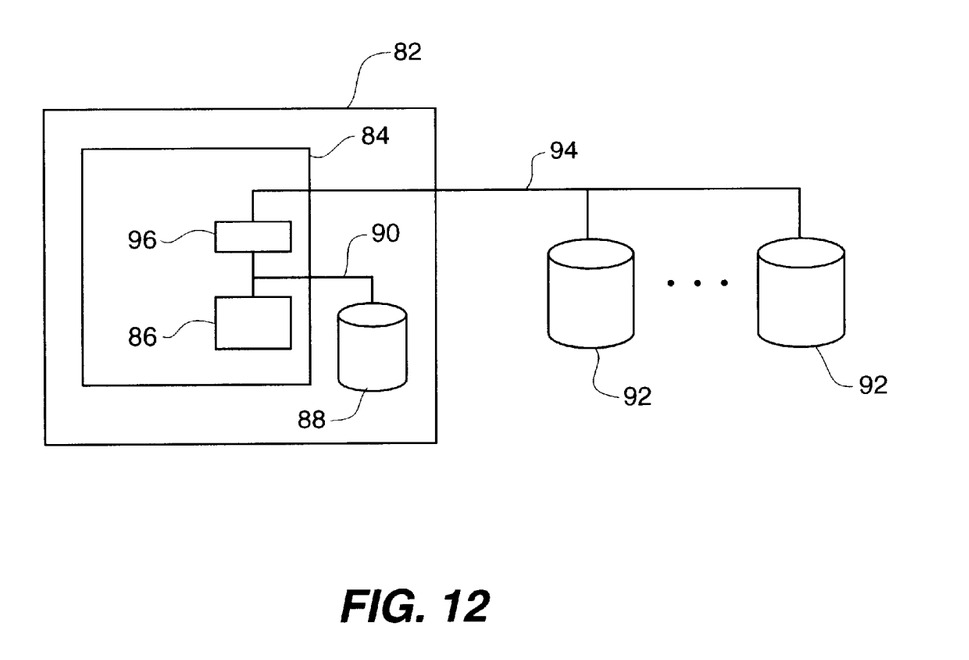
FIG. 12 shows a computer system having devices with dissimilar characteristics coupled to a controller.

FIG. 12 shows another application of an isolator/bridge. Here, a computer 82 has an electronics board 84 contained therein. A bus controller 86 on board 84 is used to communicate with one or more devices 88 inside the computer chassis, via bus 90. Use of bus isolator 96 allows for coupling external devices 92 to controller 86 via bus 94. This bus may have different performance characteristics than internal bus 90, and hence the bus isolator provides downwards compatibility. When advances in bus technology occur, certain older devices are still capable of being used in combination with new, higher performance devices.

In asynchronous bus isolating/bridging applications, such as a SCSI isolator or bus extender, signals need to be precisely delayed by a predetermined amount in order to guarantee or even improve setup or hold times on the resultant output bus. Thus, the above described delay techniques are particularly useful for such isolation/bridge applications. However, it should be noted that the above uses of an isolator/bridge are by way of example only. The key aspect of the invention described herein is how to provide precise delays, and a bus isolator is but one example of why precise delays might be desired. There are likely numerous other applications for precise delays that could advantageously utilize the techniques described hereinabove.

While we have illustrated and described the preferred embodiments of our invention, it is to be understood that we do not limit ourselves to the precise constructions herein disclosed, and the right is reserved to all changes and modifications coming within the scope of the invention as defined in the appended claims.

We claim:

1. A method for providing delay precision in a circuit, comprising the steps of:

providing a plurality of delay cells serially cascaded together to form a ring, which said plurality of delay cells having a delay based upon at least one control signal; and wherein said at least one control signal coupling to a second plurality of delay cells; and wherein said second plurality of delay cells coupling to a multiplexor.

2. A circuit, comprising:

an oscillator comprising a delay cell having a delay based upon a current control signal coupled thereto;

a plurality of delay cells coupled to said current control signal for controlling delay of said plurality of delay cells based upon current provided by said current control signal to said plurality of delay cells; and a multiplexer having a plurality of inputs, wherein said plurality of delay cells are coupled to said plurality of inputs.

3. A circuit, comprising:

a clock signal;

a phase-locked loop, coupled to said clock signal, said circuit comprising at least one cell having a cell delay based upon a control current;

a plurality of delay cells, coupled to said phase-locked loop, each having said cell delay based upon a mirrored control current; and a multiplexer having a plurality of inputs, wherein said plurality of delay cells are coupled to said plurality of inputs.

4. A circuit, comprising:

an oscillator comprising a plurality of inverters;

a current control signal coupled to at least one of said plurality of inverters for controlling delay of the at least one inverter based upon current provided by the current control signal;

a plurality of delay cells coupled to said current control signal for controlling delay of said plurality of delay cells based upon the current provided by said current control signal; and a multiplexer having a plurality of inputs, wherein said plurality of delay cells are coupled to said plurality of inputs.

5. A computer system comprising a first bus and second bus, said first bus and second bus coupled together by a bridge circuit, said bridge circuit comprising a first port for receiving a plurality of first signals, a second port for transmitting a plurality of second signals, and a delay circuit coupled between the first and second port, said delay circuit comprising:

an oscillator comprising a delay cell having a delay based upon a control signal coupled thereto; and a second delay cell coupled to the control signal.

6. The computer system of claim 5, wherein the control signal is a current.

7. The computer system of claim 5, wherein the second delay cell is coupled to the control signal through a current mirror.

8. A computer system comprising a first bus and second bus, said first bus and second bus coupled together by a bridge circuit, said bridge circuit comprising a first port for receiving a plurality of first signals, a second port for transmitting a plurality of second signals, and a delay circuit coupled between the first and second port, said delay circuit comprising:

an oscillator comprising a plurality of inverters;

a control signal coupled to at least one of the inverters; and at least one delay cell coupled to the control signal.

9. The computer system of claim 8, wherein the control signal is a current.

10. The computer system of claim 8, wherein the at least one delay cell is coupled to the control signal through a current mirror.

11. A computer system comprising a first bus and second bus, said first bus and second bus coupled together by a bridge circuit, said bridge circuit comprising a first port for receiving a plurality of first signals, a second port for transmitting a plurality of second signals, and a delay circuit coupled between the first and second port, said delay circuit comprising:

a clock signal;

a phase-locked loop, coupled to the clock signal, comprising at least one cell having a cell delay based upon a control signal; and at least one delay cell, coupled to the phase-locked loop, having a delay corresponding to the cell delay, wherein the control signal is a current.

12. A computer system comprising a first bus and second bus, said first bus and second bus coupled together by a bridge circuit, said bridge circuit comprising a first port for receiving a plurality of first signals, a second port for transmitting a plurality of second signals, and a delay circuit coupled between the first and second port, said delay circuit comprising:

a clock signal;

a phase-locked loop, coupled to the clock signal, comprising at least one cell having a cell delay based upon a control signal; and at least one delay cell, coupled to the phase-locked loop, having a delay corresponding to the cell delay, wherein the at least one delay cell is coupled to the control signal through a current mirror.

13. A method for providing delay precision in a circuit, comprising the steps of:

providing a plurality of delay cells serially cascaded together to form a ring, said plurality of delay cells having a delay based upon at least one current control signal; and coupling said at least one current control signal to another delay cell, wherein said another delay cell couples a signal from one digital logic element to another digital logic element.

14. The method of claim 13, where the signal is a data signal.

15. A method of providing timing delays, comprising the step of:

mirroring current to a first delay cell within a clock circuit and a second delay cell within a delay circuit, wherein the delay cell is coupled between a first logic element and a second logic element.

16. The method of claim 15, wherein the first logic element is coupled to a first bus, and the second logic element is coupled to a second bus.

* * * * *